(12) United States Patent
Kim et al.

(10) Patent No.: US 12,727,369 B2
(45) Date of Patent: Sep. 1, 2026

(54) DISPLAY DEVICE

(71) Applicant: Samsung Display Co., Ltd., Yongin-si (KR)

(72) Inventors: Kihyun Kim, Yongin-si (KR); Hyunsang Seo, Yongin-si (KR); Younggil Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 366 days.

(21) Appl. No.: 18/358,486

(22) Filed: Jul. 25, 2023

(65) Prior Publication Data

US 2024/0147819 A1 May 2, 2024

(30) Foreign Application Priority Data

Oct. 12, 2022 (KR) ........................ 10-2022-0130922

(51) Int. Cl.
*H10K 59/80* (2023.01)
*H10K 59/40* (2023.01)

(52) U.S. Cl.
CPC ......... *H10K 59/8791* (2023.02); *H10K 59/40* (2023.02); *H10K 59/873* (2023.02)

(58) Field of Classification Search
CPC .. H10K 59/8791; H10K 59/40; H10K 59/873; H10K 59/879; H10K 59/8731; H10K 59/8792; H10K 59/12; H10K 50/86; H10K 50/11; H10K 50/81; H10K 50/82; H10K 50/844
See application file for complete search history.

(56) References Cited

U.S. PATENT DOCUMENTS

2022/0052300 A1 2/2022 Seong et al.
2022/0140283 A1 5/2022 Kim et al.
2022/0285655 A1 * 9/2022 Lee ...................... H10K 59/878

FOREIGN PATENT DOCUMENTS

| | | | |
|---|---|---|---|
| CN | 103579520 | A | 2/2014 |
| CN | 111821972 | A | 10/2020 |
| JP | 1999-258404 | A | 9/1999 |
| JP | 2016-003349 | A | 1/2016 |
| KR | 10-2022-0021066 | A | 2/2022 |
| KR | 10-2022-0058720 | A | 5/2022 |
| KR | 10-2022-0125903 | A | 9/2022 |

* cited by examiner

*Primary Examiner* — Elmito Breval
(74) *Attorney, Agent, or Firm* — Womble Bond Dickinson (US) LLP

(57) ABSTRACT

A display device includes a substrate, a display element on the substrate, the display element including a pixel electrode, an emission layer, and an opposite electrode, a functional layer on the display element, and a thin-film encapsulation layer on the functional layer, wherein the functional layer includes a plurality of grains and a grain boundary between the plurality of grains.

18 Claims, 10 Drawing Sheets

DISPLAY DEVICE

CROSS-REFERENCE TO RELATED APPLICATION

This application claims priority to and the benefit of Korean Patent Application No. 10-2022-0130922, filed on Oct. 12, 2022, in the Korean Intellectual Property Office, the entire content of which is hereby incorporated by reference.

BACKGROUND

1. Field

One or more embodiments of the present disclosure relate to a display device.

2. Description of the Related Art

Recently, the usage of display devices has diversified. Also, display devices have become thinner and more lightweight, and thus, the use of display devices has expanded. As display devices are used in various fields, the demand for display devices that provide high-quality images is increasing.

SUMMARY

One or more embodiments include a display device in which light efficiency and visibility are improved to provide high-quality images. However, this is merely an example, and the scope of the disclosure is not limited thereby.

Additional aspects of embodiments will be set forth in part in the description which follows and, in part, will be apparent from the description, or may be learned by practice of the presented embodiments of the disclosure.

According to one or more embodiments, a display device includes a substrate, a display element on the substrate, the display element including a pixel electrode, an emission layer, and an opposite electrode, a functional layer on the display element, and a thin-film encapsulation layer on the functional layer, wherein the functional layer includes a plurality of grains and a grain boundary between the plurality of grains.

In an embodiment, the grains may be provided in an island type.

In an embodiment, the functional layer may include an opening between the grains.

In an embodiment, the grains may be grown in a [110] crystal direction.

In an embodiment, the grains may each have a grain size of 8 nm or more and 20 nm or less.

In an embodiment, the functional layer may include bismuth (Bi), ytterbium (Yb), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or any combination thereof.

In an embodiment, the display device may further include a capping layer between the opposite electrode and the functional layer.

In an embodiment, the functional layer may include an opening between the grains, and the opening may expose the capping layer.

In an embodiment, the functional layer may include bismuth (Bi), and a first area including a lower surface of the functional layer may include a smaller amount of oxygen than a second area including an upper surface of the functional layer.

In an embodiment, oxygen content in the first area may be greater than 0 mass % and less than or equal to 25 mass %.

In an embodiment, the display device may further include a light blocking layer on the thin-film encapsulation layer, and a reflection control layer.

In an embodiment, the light blocking layer may include an opening corresponding to an emission area of the display element, and the reflection control layer may include a dye, a pigment, or any combination thereof.

In an embodiment, the display device may further include a touch sensing layer between the thin-film encapsulation layer and the light blocking layer.

According to one or more embodiments, a display device includes a substrate, a display element on the substrate, the display element including a pixel electrode, an emission layer, and an opposite electrode, a functional layer on the display element, a thin-film encapsulation layer on the functional layer, a light blocking layer on the thin-film encapsulation layer, the light blocking layer including an opening corresponding to an emission area of the display element, and a reflection control layer filling the opening of the light blocking layer, wherein the functional layer includes bismuth (Bi) and includes a plurality of island-type grains and a grain boundary between the plurality of grains.

In an embodiment, the grains may be grown in a [110] crystal direction.

In an embodiment, the grains may each have a grain size of 8 nm or more and 20 nm or less.

In an embodiment, the display device may further include a capping layer between the opposite electrode and the functional layer, wherein the thin-film encapsulation layer may include a first inorganic encapsulation layer on the functional layer.

In an embodiment, a first area including a lower surface of the functional layer may include a smaller amount of oxygen than a second area including an upper surface of the functional layer.

In an embodiment, the functional layer may include an opening exposing the capping layer.

In an embodiment, the thin-film encapsulation layer may further include an organic encapsulation layer and a second inorganic encapsulation layer, which are sequentially on the first inorganic encapsulation layer in this stated order.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
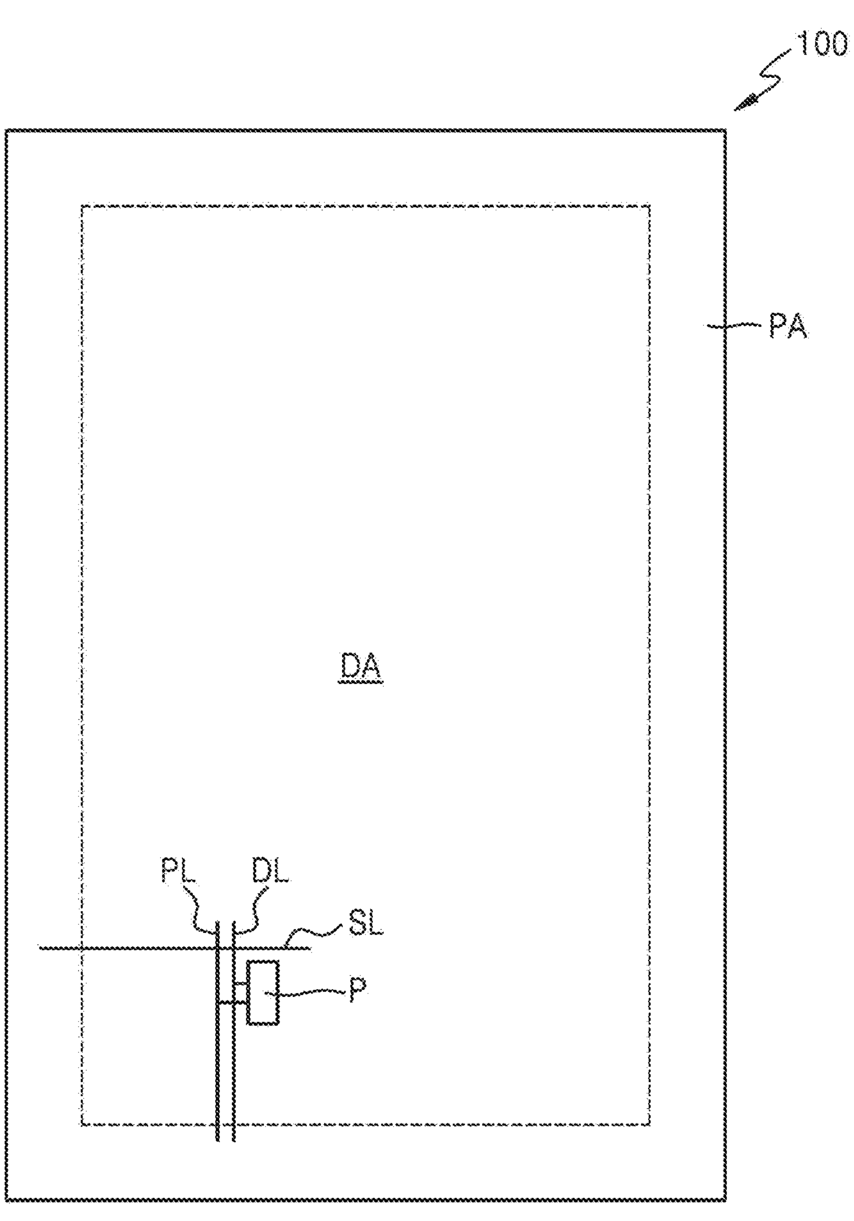
FIG. 1 is a plan view schematically illustrating a portion of a display device, according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in more detail in the written description. Effects and features of the disclosure, and methods of achieving them will be clarified with reference to embodiments described below in more detail with reference to the drawings. However, the disclosure is not limited to the following embodiments and may be embodied in various forms.

Hereinafter, embodiments will be described in more detail with reference to the accompanying drawings. When describing embodiments with reference to the accompanying drawings, the same or corresponding elements are denoted by the same reference numerals.

It will be understood that although the terms "first," "second," etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "include" and/or "comprise" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. For example, intervening layers, regions, or elements may be present.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

In this specification, the expression "A and/or B" indicates only A, only B, or both A and B.

Also, sizes of elements in the drawings may be exaggerated or reduced for convenience of explanation. For example, because sizes and thicknesses of elements in the drawings may be arbitrarily illustrated for convenience of explanation, the disclosure is not limited thereto.

When a certain embodiment may be implemented differently, a set or specific process order may be performed differently from the described order. For example, two consecutively described processes may be performed substantially at the same time or performed in an order opposite to the described order.

It will be further understood that, when layers, regions, or components are referred to as being connected to each other, they may be directly connected to each other or indirectly connected to each other with intervening layers, regions, or components therebetween. For example, when layers, regions, or elements are referred to as being electrically connected to each other, they may be directly electrically connected to each other or indirectly electrically connected to each other with intervening layers, regions, or elements therebetween.

FIG. 1 is a plan view schematically illustrating a display device according to an embodiment.

Referring to FIG. 1, a substrate 100 of the display device may be divided into a display area DA and a peripheral area PA around the display area DA. The display device 10 may provide certain images by using light emitted from a plurality of pixels P in the display area DA.

Each of the pixels P may include a display element, such as an organic light-emitting diode and/or an inorganic light-emitting diode, and may emit, for example, red light, green light, blue light, or white light. For example, each of the pixels P may be connected to a pixel circuit including a thin-film transistor, a storage capacitor, and the like. The pixel circuit may be connected to a scan line SL, a data line DL crossing the scan line SL, and a driving voltage line PL. The scan line SL may extend in the x direction, and the data line DL and the driving voltage line PL may extend in the y direction.

The pixel circuit is configured to drive the pixel P to emit light, and the display area DA is configured to provide a certain image through the light emitted from the pixel P. The pixel P as used herein may be defined as an emission area configured to emit one selected from red light, green light, blue light, and white light, as described above.

The peripheral area PA is an area in which the pixels P are not arranged and through which an image is not provided. A terminal part, to which an internal driving circuit for driving the pixels P, a power supply line, and a printed circuit board or a driver integrated circuit (IC) including a driving circuit are connected, may be arranged in the peripheral area PA.

The display device according to an embodiment may include an organic light-emitting display, an inorganic light-emitting display (an inorganic electroluminescence (EL) display), a quantum dot display, and/or the like. Hereinafter, an organic light-emitting display will be described as an example of the display device according to an embodiment, but the display device of the disclosure is not limited thereto. Features to be described below may be applied to various suitable types or kinds of display devices as described above.

Figure 2:
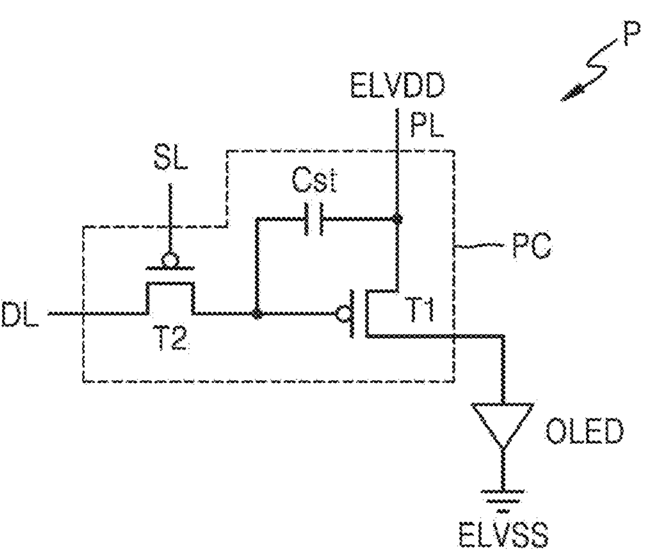
FIG. 2 is an equivalent circuit diagram of a pixel included in the display device of FIG. 1.

FIG. 2 illustrates a display element and a pixel circuit PC connected thereto in a pixel P of a display device, according to an embodiment.

Referring to FIG. 2, an organic light-emitting diode OLED, which is the display element, is connected to the pixel circuit PC. The pixel circuit PC may include a first thin-film transistor T1, a second thin-film transistor T2, and a storage capacitor Cst. The organic light-emitting diode OLED may be configured to emit, for example, red light, green light, or blue light, or may be configured to emit, for example, red light, green light, blue light, or white light.

The second thin-film transistor T2 acts as a switching thin-film transistor. The second thin-film transistor T2 may be connected to a scan line SL and a data line DL, and may be configured to transmit, to the first thin-film transistor T1, a data voltage input from the data line DL in response to a switching voltage input from the scan line SL. The storage capacitor Cst may be connected to the second thin-film transistor T2 and a driving voltage line PL, and may be configured to store a voltage corresponding to a difference between a voltage received from the second thin-film transistor T2 and a first power supply voltage ELVDD supplied to the driving voltage line PL.

The first thin-film transistor T1 acts as a driving thin-film transistor. The first thin-film transistor T1 may be connected to the driving voltage line PL and the storage capacitor Cst, and may be configured to control a driving current flowing from the driving voltage line PL to the organic light-emitting diode OLED according to a voltage value stored in the storage capacitor Cst. The organic light-emitting diode OLED may be configured to emit light having a certain luminance according to the driving current. An opposite electrode (e.g., a cathode) of the organic light-emitting diode OLED may be configured to receive a second power supply voltage ELVSS.

FIG. 2 illustrates that the pixel circuit PC includes two thin-film transistors and one storage capacitor, but in another embodiment, the number of thin-film transistors or the number of storage capacitors may be variously changed according to the design of the pixel circuit PC.

Figure 3:
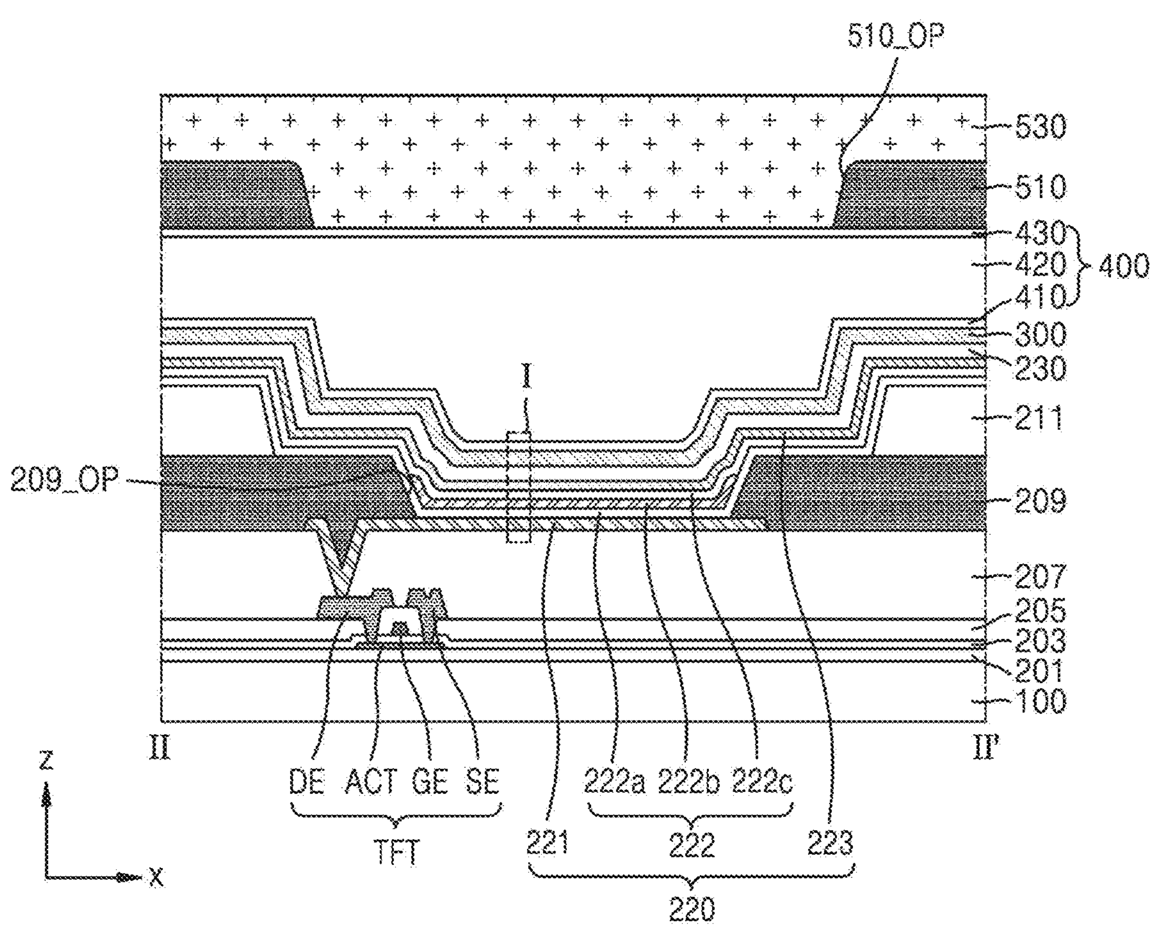
FIG. 3 is a schematic cross-sectional view of a display device according to an embodiment.

FIG. 3 is a schematic cross-sectional view of a display device according to an embodiment.

Referring to FIG. 3, the display device according to an embodiment may include a display element 220 having an emission area on a substrate 100, a functional layer 300, a thin-film encapsulation layer 400, a light blocking layer 510 having an opening 510_OP, and a reflection control layer 530 filling the opening 510_OP. The display element 220 may be an organic light-emitting diode (see OLED of FIG. 2).

In an embodiment, the display device may further include a capping layer 230 between the display element 220 and the functional layer 300.

The substrate 100 may include a single glass layer. In some embodiments, the substrate 100 may include a polymer resin. The substrate 100 including a polymer resin may have a structure in which a polymer resin-containing layer and an inorganic layer are stacked. In an embodiment, the substrate 100 may include a polymer resin, such as, for example, polyethersulfone, polyarylate, polyether imide, polyethylene naphthalate, polyethylene terephthalate, polyphenylene sulfide, polyimide, polycarbonate, cellulose triacetate, and/or cellulose acetate propionate, and the substrate 100 may be flexible. The substrate 100 may include glass containing $SiO_2$ as a main component and/or a resin, such as, for example, reinforced plastic, and the substrate 100 may be rigid.

A thin-film transistor TFT may include a semiconductor layer ACT, a gate electrode GE, a source electrode SE, and a drain electrode DE. The semiconductor layer ACT may include amorphous silicon, polycrystalline silicon, and/or an organic semiconductor material. In order to secure electrically insulating properties between the semiconductor layer ACT and the gate electrode GE, a gate insulating layer 203 including an inorganic material, such as silicon oxide, silicon nitride, and/or silicon oxynitride, may be between the semiconductor layer ACT and the gate electrode GE. In addition, an interlayer insulating layer 205 including an inorganic material, such as, for example, silicon oxide, silicon nitride, and/or silicon oxynitride, may be above the gate electrode GE. The source electrode SE and the drain electrode DE may be on the interlayer insulating layer 205. The gate insulating layer 203 and the interlayer insulating layer 205 each including the inorganic material may be formed by chemical vapor deposition (CVD) and/or atomic layer deposition (ALD).

The gate electrode GE, the source electrode SE, and the drain electrode DE may each include various suitable conductive materials (e.g., electrically conductive materials). The gate electrode GE may include at least one selected from molybdenum, aluminum, copper, and titanium, and may have a multilayer structure when necessary or desired. For example, the gate electrode GE may have a single molybdenum layer, or may have a three-layer structure including a molybdenum layer, an aluminum layer, and a molybdenum layer. The source electrode SE and the drain electrode DE may each include at least one selected from copper, titanium, and aluminum, and may each have a multilayer structure when necessary or desired. For example, the source electrode SE and the drain electrode DE may each have a three-layer structure including a titanium layer, an aluminum layer, and a titanium layer.

A buffer layer 201 including an inorganic material, such as, for example, silicon oxide, silicon nitride, and/or silicon oxynitride, may be between the thin-film transistor TFT having the above-described structure and the substrate 100. The buffer layer 201 may increase the smoothness of the upper surface of the substrate 100, and/or may prevent, minimize, or reduce infiltration of impurities from the substrate 100 and/or the like to the semiconductor layer ACT of the thin-film transistor TFT.

Figure 5:
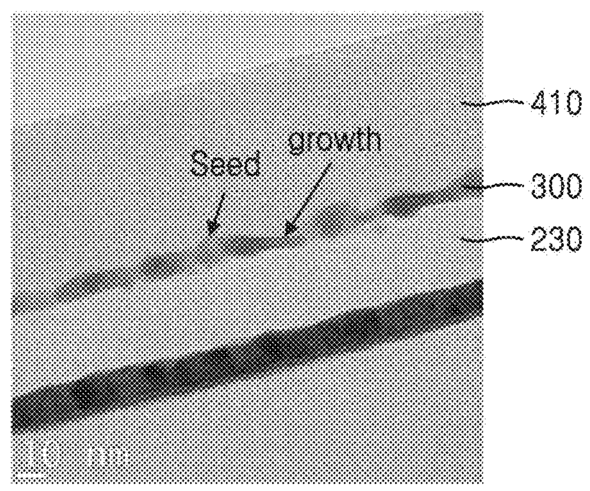
FIG. 5 is an image showing a growth direction of a grain in a functional layer included in a display device, according to an embodiment.

A planarization insulating layer 207 may be on the thin-film transistor TFT. The planarization insulating layer 207 may include an organic material, such as, for example, acryl, benzocyclobutene (BCB), and/or hexamethyldisiloxane (HMDSO). Although FIG. 5 illustrates that the planarization insulating layer 207 is a single layer, the planarization insulating layer 207 may be a plurality of layers.

A pixel electrode 221 may be on the planarization insulating layer 207. The pixel electrode 221 is arranged for each pixel. The pixel electrodes 221 corresponding to adjacent pixels may be spaced apart from each other.

The pixel electrode 221 may be a reflective electrode. In some embodiments, the pixel electrode 221 may include a reflective layer and a transparent or semitransparent electrode layer on the reflective layer. The reflective layer may include Ag, Mg, Al, Pt, Pd, Au, Ni, Nd, Ir, Cr, or any compound thereof. The transparent or semitransparent electrode layer may include at least one selected from indium tin oxide (ITO), indium zinc oxide (IZO), zinc oxide (ZnO), indium oxide ($In2O_3$), indium gallium oxide (IGO), and aluminum zinc oxide (AZO). In some embodiments, the pixel electrode 221 may have a three-layer structure including an ITO layer, an Ag layer, and an ITO layer.

A pixel defining layer 209 is on the pixel electrode 221. The pixel defining layer 209 has an opening 209_OP that exposes a central portion of the pixel electrode 221. The pixel defining layer 209 may prevent or reduce occurrence of an electric arc and/or the like on the edge of the pixel electrode 221 by covering the edge of the pixel electrode 221 and increasing the distance between the edge of the pixel electrode 221 and the opposite electrode 223. The pixel defining layer 209 may include an organic insulating material, such as, for example, polyimide, polyamide, acrylic resin, BCB, HMDSO, and/or phenol resin, and may be formed by spin coating. In some embodiments, the pixel defining layer 209 may include an inorganic insulating material. In some embodiments, the pixel defining layer 209 may have a multilayer structure including an inorganic insulating material and an organic insulating material.

In some embodiments, the pixel defining layer 209 may include a light blocking material, and may be provided in black. The light blocking material may include carbon black, carbon nanotubes, a resin and/or paste including black dye, metal particles (e.g., nickel, aluminum, molybdenum, and any alloy thereof), metal oxide particles (e.g., chromium oxide), and/or metal nitride particles (e.g., chromium nitride). When the pixel defining layer 209 includes a light blocking material, the reflection of external light due to the metal structures below the pixel defining layer 209 may be reduced.

A spacer 211 may be on the pixel defining layer 209. The spacer 211 may prevent or reduce damage to layers between the substrate 100 and the spacer 211 by a mask used in a process of forming an emission layer **222*b* to be further described below. The spacer 211 may include the same material as that of the pixel defining layer 209. In some embodiments, the spacer 211** may include a light blocking material.

The emission layer **222*b* may be in the opening 209_OP of the pixel defining layer 209. The emission layer 222*b*** may include an organic material including a fluorescent or phosphorescent material capable of emitting red light, green light, or red light. The organic material described above may include a low molecular weight organic material and/or a high molecular weight organic material.

A first common layer **222*a* and a second common layer 222*c* may be below and above the emission layer 222*b*, respectively. The first common layer 222*a* may include, for example, a hole transport layer (HTL) or may include, for example, an HTL and a hole injection layer (HIL). The second common layer 222*c* may be on the emission layer 222*b*, and may include an electron transport layer (ETL) and/or an electron injection layer (EIL). The second common layer 222*c* is optional. In some embodiments, the second common layer 222*c*** may not be provided.

The emission layer **222*b* may be arranged for each pixel to correspond to the opening 209_OP of the pixel defining layer 209. Similar to an opposite electrode 223 to be further described below, the first common layer 222*a* and the second common layer 222*c* may be a common layer integrally formed as a single body to entirely cover the substrate 100, for example, the entire display area of the substrate 100**.

The opposite electrode 223 may be a cathode that is an electron injection electrode. In this case, as a material for the opposite electrode 223, a metal having a low work function, an alloy, an electrically conductive compound, or any combination thereof may be used. The opposite electrode 223 may be a transmissive electrode, a transflective electrode, or a reflective electrode.

The opposite electrode 223 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The opposite electrode 223 may have a single-layer structure including a single layer or a multilayer structure including a plurality of layers.

The capping layer 230 may improve the external light emission efficiency of the organic light-emitting element, based on the principle of constructive interference. The capping layer 230 may include a material having a refractive index of 1.6 or more (e.g., at a wavelength of 589 nm). The capping layer 230 may have a thickness of 1 nm to 200 nm, for example, 5 nm to 150 nm, or 10 nm to 50 nm.

The capping layer 230 may be an organic capping layer including an organic material, an inorganic capping layer including an inorganic material, or a composite capping layer including an organic material and an inorganic material.

For example, the capping layer 230 may include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compounds, the heterocyclic compounds, and the amine group-containing compounds may be optionally substituted with a substituent including O, N, S, Se, Si, F, Cl, Br, I, or any combination thereof.

In an embodiment, the functional layer 300 may be on the capping layer 230. In another embodiment, when the capping layer 230 is omitted, the functional layer 300 may be on the display element 220. In an embodiment, the functional layer 300 may be on the entire surface of the display area DA and may be formed through a continuous process without a separate mask process. In another embodiment, the functional layer 300 may be arranged to correspond to the emission area. The functional layer 300 may be formed by thermal evaporation of the inorganic material.

The functional layer 300 may reduce external light reflectance of the display device by using destructive interference. For example, first reflected light obtained when light incident on the upper surface of the display device is reflected from the upper surface of the functional layer 300 may destructively interfere with second reflected light reflected by structures under the functional layer 300 (e.g., the opposite electrode 223, the pixel electrode 221, etc.).

When the functional layer 300 is on the capping layer 230, as illustrated in FIG. 3, the thickness and/or the refractive index of the capping layer 230 may be adjusted so that the first reflected light and the second reflected light have a phase difference that destructively interferes with each other.

For example, the functional layer 300 may improve display quality and visibility of the display device by reducing external light reflectance.

The functional layer 300 may include an inorganic material having low reflectivity. The functional layer 300 may include an inorganic material having a high refractive index. The functional layer 300 may include bismuth (Bi), ytterbium (Yb), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or any combination thereof.

In an embodiment, the inorganic material included in the functional layer 300 may have a refractive index of 1 or more (e.g., at a wavelength of 589 nm). In an embodiment, when the functional layer 300 includes bismuth (Bi), the functional layer 300 may have a refractive index of 1.8 to 2.5 (e.g., at a wavelength of 589 nm).

In an embodiment, the functional layer 300 may have a thickness of 0.1 nm to 50 nm, for example, 5 nm to 15 nm.

The thin-film encapsulation layer 400 may be on the functional layer 300. The thin-film encapsulation layer 400 may include at least one inorganic encapsulation layer and at least one organic encapsulation layer. For example, as illustrated in FIG. 3, the thin-film encapsulation layer 400 may include a first inorganic encapsulation layer 410, an organic encapsulation layer 420, and a second inorganic encapsulation layer 430.

The first inorganic encapsulation layer 410 and the second inorganic encapsulation layer 430 may each include at least one inorganic insulating material selected from aluminum oxide, titanium oxide, tantalum oxide, hafnium oxide, zinc oxide, silicon oxide, silicon nitride, and silicon oxynitride. The first inorganic encapsulation layer 410 and the second inorganic encapsulation layer 430 may each have a single-layer or multilayer structure including the inorganic insulating material described above.

The organic encapsulation layer 420 may reduce internal stress of the first inorganic encapsulation layer 410 and/or the second inorganic encapsulation layer 430. The organic encapsulation layer 420 may include a polymer-based material. The polymer-based material may include polyethylene terephthalate, polyethylene naphthalate, polycarbonate, polyimide, polyethylene sulfonate, polyoxymethylene, polyarylate, hexamethyldisiloxane, acrylic resin (e.g., polymethylmethacrylate, polyacrylic acid, etc.), or any combination thereof.

The organic encapsulation layer 420 may be formed by applying a monomer having flowability and then curing a monomer layer by using heat and/or light, such as, for example, ultraviolet light. In some embodiments, the organic encapsulation layer 420 may be formed by applying the polymer-based material described above.

Even when cracks occur in the thin-film encapsulation layer 400 through the multilayer structure described above, the thin-film encapsulation layer 400 may prevent or reduce connection of such cracks to each other between the first inorganic encapsulation layer 410 and the organic encapsulation layer 420 or between the organic encapsulation layer 420 and the second inorganic encapsulation layer 430. Therefore, it is possible to prevent, minimize, or reduce formation of a path through which ambient moisture and/or oxygen penetrates into the display area DA.

An anti-reflection layer may be on the thin-film encapsulation layer 400. The anti-reflection layer may include the light blocking layer 510 and the reflection control layer 530.

The light blocking layer 510 may be on the thin-film encapsulation layer 400. The light blocking layer 510 may include a light blocking insulating material (e.g., a light blocking electrically insulating material). Accordingly, the light blocking layer 510 is a colored, opaque light blocking insulating layer (e.g., an opaque light blocking electrically insulating layer). For example, the light blocking layer 510 may appear black. For example, the light blocking layer 510 may include a polyimide (PI)-based binder and a pigment in which red, green, and blue colors are mixed together. In some embodiments, the light blocking layer 510 may include a binder resin and a mixture of a lactam-based black pigment and a blue pigment. In some embodiments, the light blocking layer 510 may include carbon black.

The light blocking layer 510 has an opening 510_OP overlapping the emission area of the display element. The emission area may be defined by the opening 209_OP of the pixel defining layer 209. The opening 510_OP of the light blocking layer 510 may be filled with the reflection control layer 530.

The reflection control layer 530 may be on the light blocking layer 510 while filling the opening 510_OP of the light blocking layer 510. For example, the reflection control layer 530 may be on the thin-film encapsulation layer 400 and the light blocking layer 510. The reflection control layer 530 may selectively absorb light having a wavelength of a partial band among pieces of light reflected from inside the display device or pieces of light incident from the outside of the display device.

The reflection control layer 530 may include an organic material layer including a dye, a pigment, or a combination thereof. According to an embodiment, the reflection control layer 530 may include an oxazine-based compound, a cyanine-based compound, a tetraazo morphine-based compound, and/or a squarylium-based compound.

For example, the reflection control layer 530 may include a compound represented by one selected from Formulae 1 to 4 below:

Formula 1

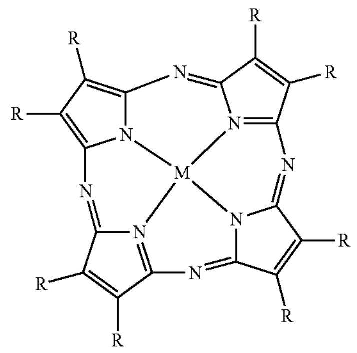

Formula 2

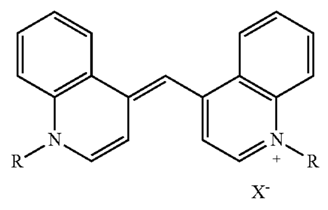

Formula 3

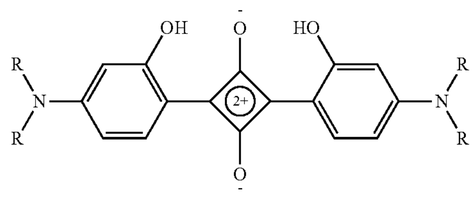

Formula 4

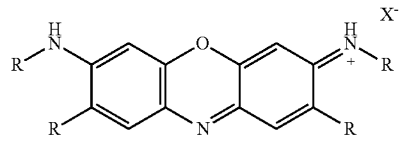

In Formulae 1 to 4,

M may be a metal, $X^-$ may be a monovalent anion, and

R(s) may be identical to or different from each other and may each independently be selected from:

hydrogen, deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, —P(=O)$(Q_{21})(Q_{22})$, or any combination thereof; or —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, or —P(=O)$(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ may each independently be selected from: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, $X^-$ may be a halide ion, a carboxylate ion, a nitrate ion, a sulfonate ion, or a bisulfate ion.

For example, $X^-$ may be $F^-$, $Cl^-$, $Br^-$, $I^-$, $CH_3COO^-$, $NO_3^-$, $HSO_4^-$, a propionate ion, a benzene sulfonate ion, or the like.

In an embodiment, reflectance that is measured on the surface of the reflection control layer 530 in a specular component included (SCI) mode may be 10% or less. For example, the reflection control layer 530 may improve visibility by absorbing external light reflection of the display device.

In order to reduce external light reflection, the display device according to the present embodiment does not use a polarizing film or a color filter, and employs the anti-reflection layer including the functional layer 300 and the reflection control layer 530.

When a polarizing film is used to reduce external light reflection, transmittance of light emitted from the organic light-emitting diode may be significantly reduced by the polarizing film. When a color filter corresponding to the color of each pixel is used to reduce reflection of external light, a reflective color band may be generated according to a different light reflectance for each pixel, and process costs may increase due to a large number (or a relatively larger number) of process steps.

The display device according to the present embodiment employs the functional layer 300 and the reflection control layer 530, which are commonly applied to each pixel, so that light transmittance may be increased and reflection of external light may be reduced.

A cover window may be on the anti-reflection layer. The cover window may be bonded on the anti-reflection layer by a transparent adhesive member, such as an optically clear adhesive film.

Figure 4:
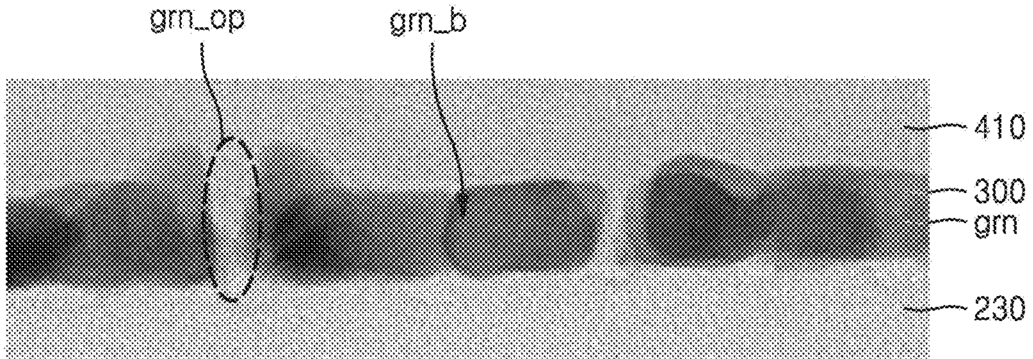
FIG. 4 is an image of a functional layer included in a display device, according to an embodiment.
Figure 6:
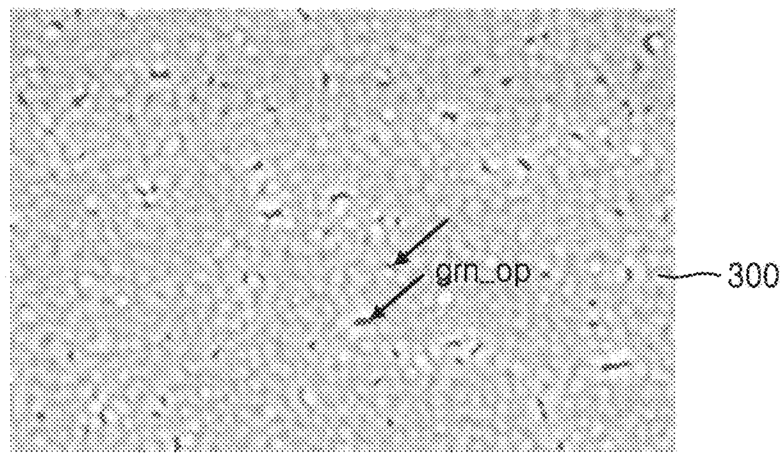
FIG. 6 is an image showing a surface state of a functional layer included in a display device, according to an embodiment.

FIGS. 4 to 6 are images of the functional layer 300 included in the display device, according to an embodiment. FIG. 4 is an image of the cross-sections of the capping layer 230, the functional layer 300, and the first inorganic encapsulation layer 410. FIG. 5 is an image showing a growth direction of a grain (e.g., a crystal grain) included in the functional layer 300. FIG. 6 is an image of the functional layer 300 taken as a plane.

Referring to FIG. 4, the functional layer 300 may be between the capping layer 230 and the first inorganic encapsulation layer 410.

The functional layer 300 may include a plurality of grains grn (e.g., crystal grains grn). The grains grn may include bismuth (Bi). The functional layer 300 may include a grain boundary grn_b between the grains grn (e.g., between adjacent ones of the grains grn).

The grains grn may be provided in an island type. For example, at least two adjacent ones of the grains grn may be present as discrete or discontiguous islands such that the at least two adjacent ones of the grains grn have a space or opening therebetween and do not physically contact each other, while remaining adjacent ones of the grains grn may or may not physically contact each other (e.g., adjacent ones of the grains grn having the grain boundary grn_b therebetween may or may not physically contact each other). Accordingly, the functional layer 300 may include an opening grn_op between the grains grn (e.g., between the at least two adjacent ones of the grains grn). The opening grn_op may expose the capping layer 230 under the functional layer 300. When the capping layer 230 is not provided, layers (e.g., the opposite electrode 223, etc.) under the functional layer 300 may be exposed.

Referring to FIGS. 4 and 5, the functional layer 300 may be provided with grains grn grown from a seed including a material forming the functional layer 300. The grains grn may include, in addition to bismuth (Bi), ytterbium (Yb), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or any combination thereof.

The functional layer 300 may include grains grn grown from the seed in a set or certain direction. The grain boundary grn_b may exist between the grains grn. The grains grn may be grown in a [110] crystal direction (or a transverse direction). The grains grn may each have a (110) crystal plane. Because the grains grn are crystals grown in a transverse direction rather than a vertical direction, the thickness of the functional layer 300 provided with the grains grn may be easily controlled.

Referring to FIG. 6, the grains grn may be provided in an island type. For example, at least two adjacent ones of the grains grn may be present as discrete or discontiguous islands such that the at least two adjacent ones of the grains grn have a space or opening therebetween and do not physically contact each other, while remaining adjacent ones of the grains grn may or may not physically contact each other (e.g., adjacent ones of the grains grn having the grain boundary grn_b therebetween may or may not physically contact each other). The functional layer 300 may include the opening grn_op between the grains grn. The opening grn_op may expose a portion of the capping layer 230. According to an embodiment, light efficiency may be adjusted by including the opening grn_op of the functional layer 300. For example, the openings grn_op allow light to pass through the functional layer 300, and thus, the light efficiency may be adjusted by adjusting the openings grn_op (e.g., by adjusting the size and/or number of openings grn_op).

Figure 7:
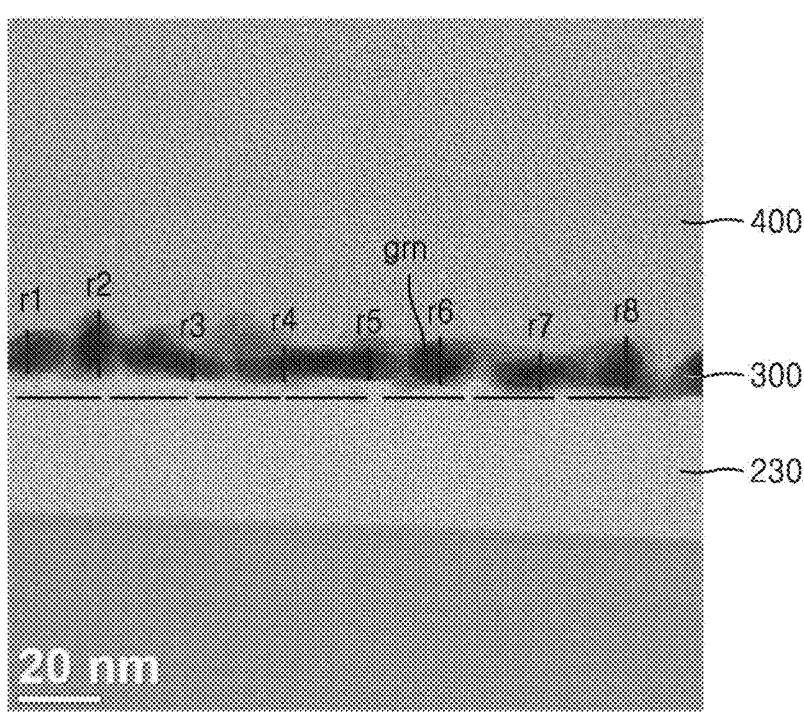
FIG. 7 is an image showing a method of measuring a grain size of grains in a functional layer included in a display device, according to an embodiment.

FIG. 7 is an image for describing a method of measuring a grain size of grains in a functional layer included in a display device, according to an embodiment.

In an embodiment, the display device may include a display element 220 and a functional layer 300 on the display element 220, and the functional layer 300 may include a plurality of island-type grains grn. In an embodiment, the grains grn may each have a grain size of 8 nm or more and 20 nm or less.

The grain size is measured by dividing a transmission electron microscopy (TEM) into 20-nm intervals at a magnification of 130,000, measuring the thicknesses of grains grn included therein, and averaging the measured values r1 to r8 (shown in FIG. 7).

Figure 8:
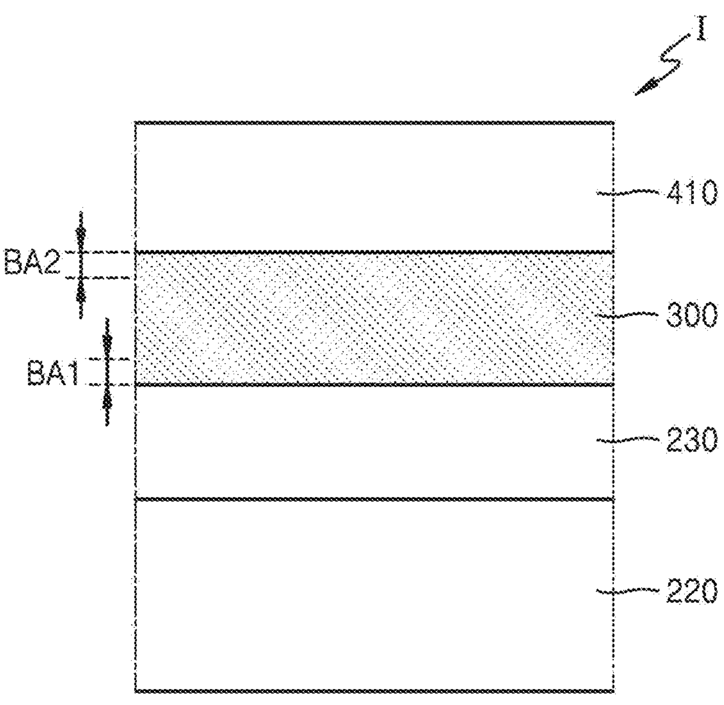
FIG. 8 is an enlarged cross-sectional view schematically illustrating a region I of FIG. 3, according to an embodiment.
Figure 9:
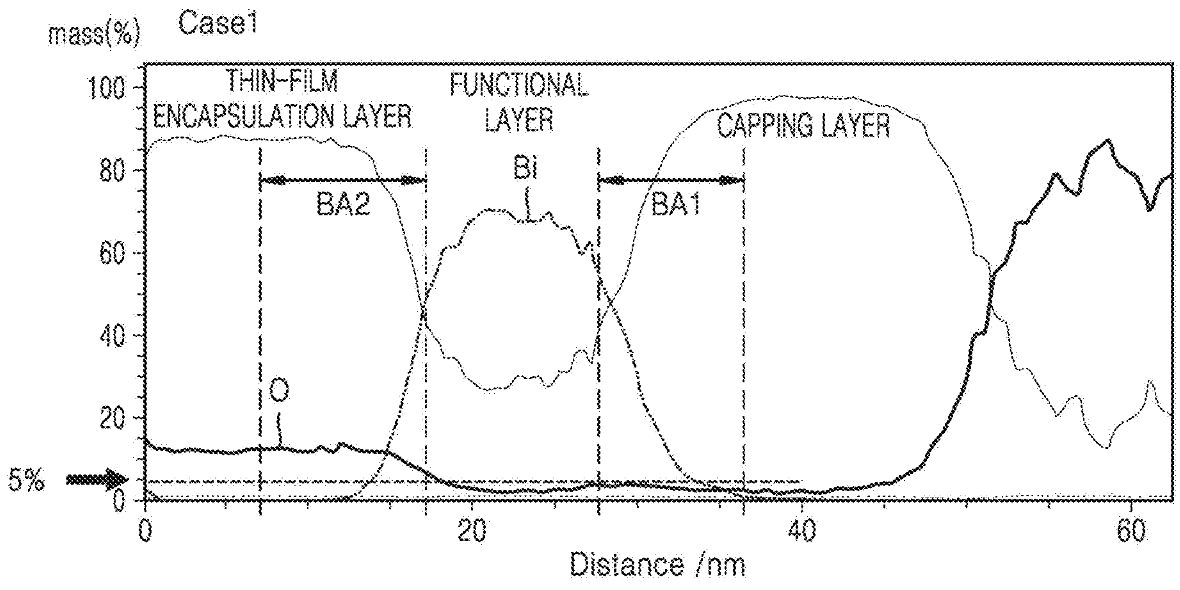
FIG. 9 is a pair of graphs illustrating a result of line profiling near an interface of a functional layer by using transmission electron microscopy-energy dispersive spectroscopy (TEM-EDS)
Figure 9:
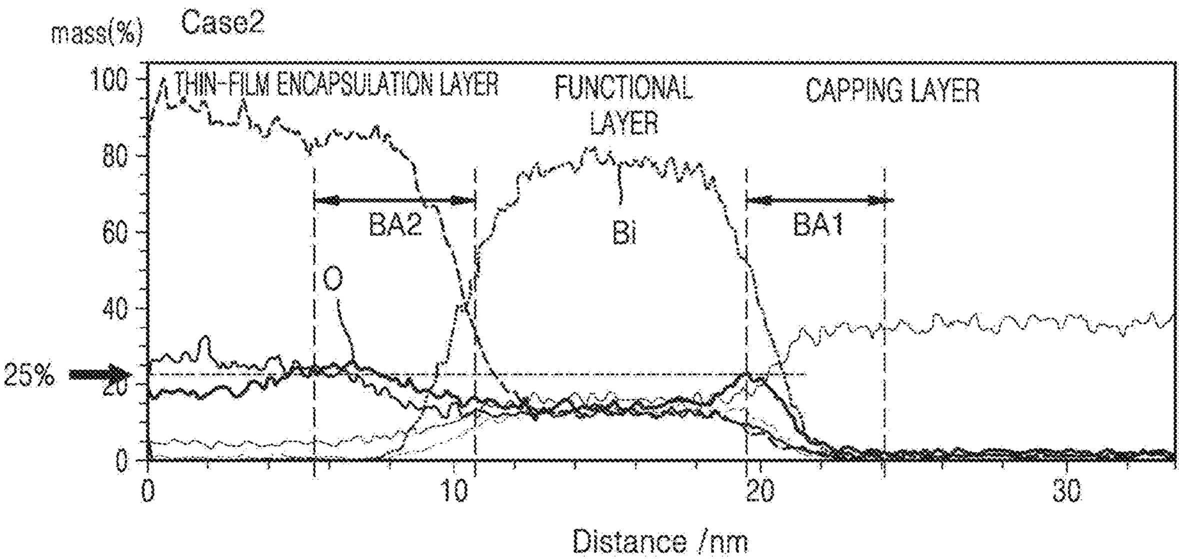

FIG. 8 is an enlarged cross-sectional view schematically illustrating a region I of FIG. 3, according to an embodiment. FIG. 9 illustrates a result of line profiling near an interface of the functional layer 300 by using transmission electron microscopy-energy dispersive spectroscopy (TEM-EDS). In FIG. 8, the same reference numerals as those in FIG. 3 denote the same members.

Referring to FIG. 8, in the display device 1 according to an embodiment, the capping layer 230, the functional layer 300, and the first inorganic encapsulation layer 410 may be sequentially stacked on the display element 220 in this stated order. Each of the display elements 220 may define a pixel.

The functional layer 300 may be between the capping layer 230 and the thin-film encapsulation layer 400. The lower surface of the functional layer 300 may be in contact (e.g., physical contact) with the capping layer 230. The upper surface of the functional layer 300 may be in contact (e.g., physical contact) with the thin-film encapsulation layer 400. When a lower portion of the functional layer 300, including the lower surface of the functional layer 300 in contact (e.g., physical contact) with the capping layer 230, is referred to as a first area BA1 and an upper portion of the functional layer 300, including the upper surface of the functional layer 300 in contact (e.g., physical contact) with the thin-film encapsulation layer 400, is referred to as a second area BA2, the first area BA1 may include a smaller amount of oxygen than the second area BA2.

For example, referring to FIG. 9, the first area BA1 including the lower surface of the functional layer 300 may include a smaller amount of oxygen than the second area BA2 including the upper surface of the functional layer 300. In an embodiment, when the functional layer 300 includes bismuth (Bi), more bismuth oxide ($BiO_x$) may be formed in the second area BA2 than in the first area BA1. The oxygen content in the first area BA1 may be greater than 0 mass % and less than or equal to 25 mass %.

In an embodiment, an oxide layer may not be formed in the first area BA1. For example, an oxide layer may not be formed between the functional layer 300 and the capping layer 230.

Referring to FIG. 9, the oxygen content in the first area BA1 in Example 1 (Case 1) and Example 2 (Case 2) is generally lower than that the oxygen content in the second area BA2. In particular, in the case of Example 1 (Case 1), about 10 mass % or more of oxygen is included in the second area BA2, but about 5 mass % or less of oxygen is included in the first area BA1. Example 1 (Case 1) is a display device having higher light efficiency than Example 2 (Case 2).

The display device according to an embodiment may include a capping layer 230, and a functional layer 300 and a thin-film encapsulation layer 400, which are on the capping layer 230. A first inorganic encapsulation layer 410 included in the thin-film encapsulation layer 400 may be on the functional layer 300. In an embodiment, the functional layer 300 may include bismuth (Bi). The first inorganic encapsulation layer 410 may include silicon oxynitride and/or silicon oxide. An oxide layer including bismuth oxide may be formed in the second area BA2 including the upper surface of the functional layer 300. In some embodiments, an oxide layer including bismuth oxide may not be formed in the first area BA1 including the lower surface of the functional layer 300.

Figure 10:
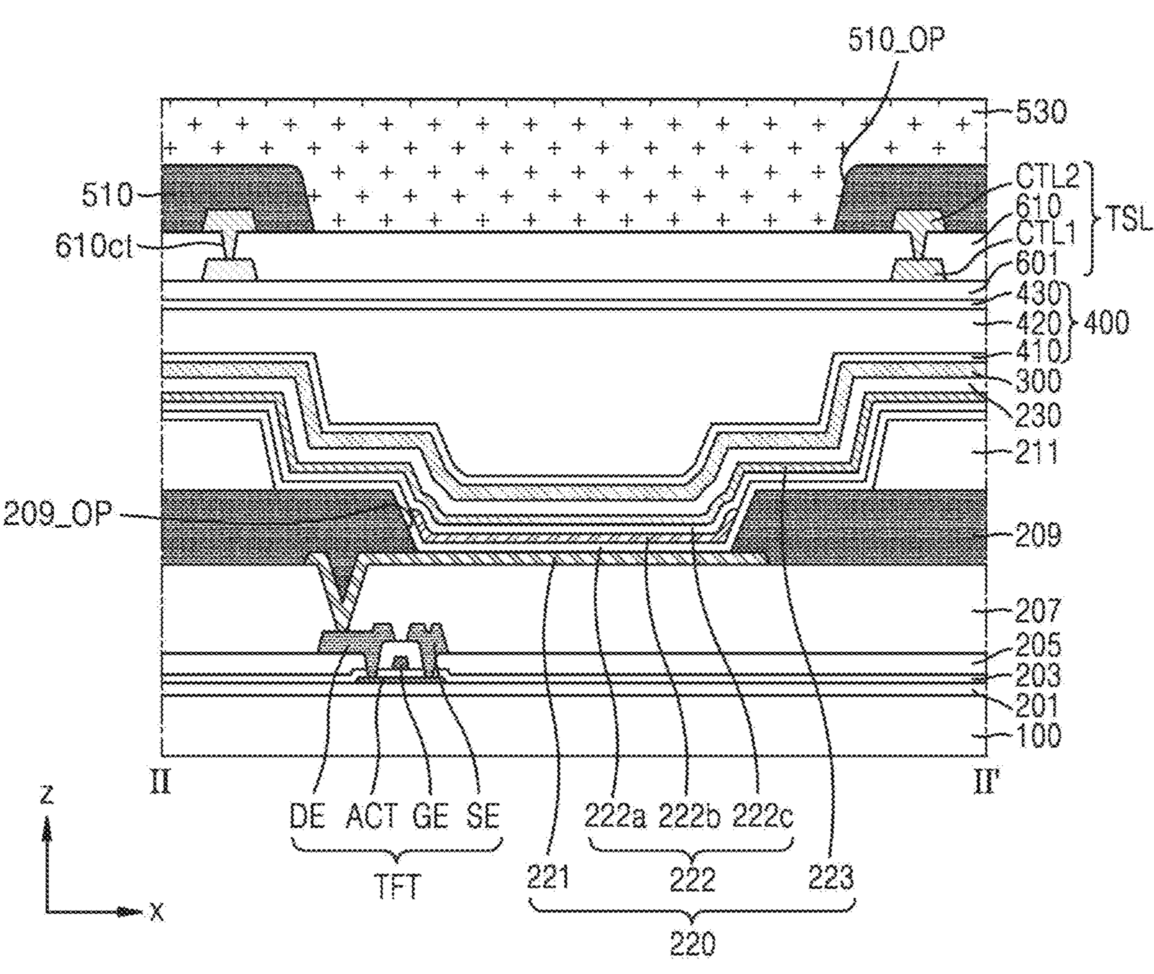
FIG. 10 is a cross-sectional view of a display device according to an embodiment.

FIG. 10 is a cross-sectional view of a display device according to an embodiment. In FIG. 10, the same reference numerals as those in FIG. 3 denote the same members, and redundant descriptions thereof are not repeated here.

Referring to FIGS. 4 and 10, the display device according to an embodiment may include a display element 220 on a substrate 100, a functional layer 300, a thin-film encapsulation layer 400, a light blocking layer 510 having an opening 510_OP, and a reflection control layer 530 filling the opening 510_OP. In an embodiment, the display device may further include a capping layer 230 between the display element 220 and the functional layer 300.

The functional layer 300 may include a plurality of grains grn and a grain boundary grn_b between the grains grn. The grains grn may be provided in an island type. The grains grn may be grown in [110] a crystal direction. A predominant crystal plane of the grains grn may be a (110) plane.

In the present embodiment, a touch sensing layer TSL may be between the thin-film encapsulation layer 400 and the light blocking layer 510. The touch sensing layer TSL is a layer configured to sense a touch input of a user. The touch sensing layer TSL may be configured to sense a touch input of a user by using at least one of various suitable touch methods, such as a resistive method and/or a capacitive method.

The touch sensing layer TSL is on the thin-film encapsulation layer 400. The touch sensing layer TSL may include a first sub-conductive layer CTL1, a second sub-conductive layer CTL2, and a touch insulating layer 610. Also, the touch sensing layer TSL may further include a touch buffer layer 601.

The touch buffer layer 601 may be directly formed on the thin-film encapsulation layer 400. The touch buffer layer 601 may prevent or reduce damage to the thin-film encapsulation layer 400 and may block or reduce interference signals that may occur when the touch sensing layer TSL is driven. The touch buffer layer 601 may include an inorganic insulating material (e.g., an inorganic electrically insulating material) and/or an organic material, such as, for example, silicon oxide ($SiO_x$), silicon nitride ($SiN_x$), and/or silicon oxynitride ($SiO_xN_y$), and may be provided as a single layer or a plurality of layers.

The first sub-conductive layer CTL1, the touch insulating layer 610, and the second sub-conductive layer CTL2 may be sequentially stacked on the touch buffer layer 601 in this stated order. The first sub-conductive layer CTL1 and the second sub-conductive layer CTL2 may be respectively below and above the touch insulating layer 610. In some embodiments, the second sub-conductive layer CTL2 may act as a sensor configured to sense a touch, and the first sub-conductive layer CTL1 may act as a connecting portion connecting the patterned second sub-conductive layers CTL2 in one direction. In another embodiment, the first sub-conductive layer CTL1 may act as a sensor configured to sense a touch, and the second sub-conductive layer CTL2 may act as a connecting portion connecting the patterned first sub-conductive layers CTL1 in one direction.

In some embodiments, both the first sub-conductive layer CTL1 and the second sub-conductive layer CTL2 may act as a sensor. In this case, the first sub-conductive layer CTL1 and the second sub-conductive layer CTL2 may be connected to each other through a contact hole 610*ct* formed in the touch insulating layer 610. Because both the first sub-conductive layer CTL1 and the second sub-conductive layer CTL2 are used as a sensor, the resistance of the touch electrode may be reduced, and thus, the response speed of the touch sensing layer TSL may be improved.

In some embodiments, the first sub-conductive layer CTL1 and the second sub-conductive layer CTL2 may have a mesh structure to allow light emitted from the display element 220 to pass therethrough. Accordingly, the first sub-conductive layer CTL1 and the second sub-conductive layer CTL2 may not overlap the emission area of the display element 220.

The first sub-conductive layer CTL1 and the second sub-conductive layer CTL2 may each include a metal layer and/or a transparent conductive layer. The metal layer may include molybdenum (Mo), silver (Ag), titanium (Ti), copper (Cu), aluminum (Al), or any alloy thereof. The transparent conductive layer may include a transparent conductive oxide, such as, for example, indium tin oxide (ITO), indium zinc oxide (IZO), zinc oxide (ZnO), and/or indium tin zinc oxide (ITZO). In addition, the transparent conductive layer may include a conductive polymer (e.g., an electrically conductive polymer), such as, for example, PEDOT, metal nanowires, graphene, and/or the like. In an embodiment, the first sub-conductive layer CTL1 and the second sub-conductive layer CTL2 may each have a three-layer structure including a titanium layer, an aluminum layer, and a titanium layer.

The touch insulating layer 610 may include an inorganic material and/or an organic material. The inorganic material may be at least one selected from silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may be at least one selected from acrylic resin, methacrylic resin, polyisoprene, vinyl resin, epoxy resin, urethane resin, cellulose resin, and perylene resin.

The light blocking layer 510 and the reflection control layer 530 may be on the touch sensing layer TSL, and may reduce reflection of external light by the conductive layer (e.g., the electrically conductive layer), the first sub-conductive layer CTL1, and the second sub-conductive layer CTL2, which are included in the touch sensing layer TSL.

Because the display device according to an embodiment includes the functional layer on the display element, the display device may provide a high-quality image having improved light efficiency and visibility.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display device comprising:

a substrate;

a display element on the substrate, the display element comprising a pixel electrode, an emission layer, and an opposite electrode;

a functional layer on the display element; and a thin-film encapsulation layer on the functional layer, wherein the functional layer comprises a plurality of grains and a grain boundary between the plurality of grains, and wherein the functional layer comprises bismuth (Bi), and a first area including a lower surface of the functional layer comprises a smaller amount of oxygen than a second area including an upper surface of the functional layer.

2. The display device of claim 1, wherein the grains are provided in an island type.

3. The display device of claim 1, wherein the functional layer comprises an opening between the grains.

4. The display device of claim 1, wherein the grains are grown in a [110] crystal direction.

5. The display device of claim 1, wherein the grains each have a grain size of 8 nm or more and 20 nm or less.

6. The display device of claim 1, wherein the functional layer comprises bismuth (Bi), ytterbium (Yb), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or any combination thereof.

7. The display device of claim 1, further comprising a capping layer between the opposite electrode and the functional layer.

8. The display device of claim 7, wherein the functional layer comprises an opening between the grains, and the opening exposes the capping layer.

9. The display device of claim 1, wherein oxygen content in the first area is greater than 0 mass % and less than or equal to 25 mass %.

10. The display device of claim 1, further comprising a light blocking layer on the thin-film encapsulation layer, and a reflection control layer.

11. The display device of claim 10, wherein the light blocking layer comprises an opening corresponding to an emission area of the display element, and the reflection control layer comprises a dye, a pigment, or any combination thereof.

12. The display device of claim 10, further comprising a touch sensing layer between the thin-film encapsulation layer and the light blocking layer.

13. A display device comprising:

a substrate;

a display element on the substrate, the display element comprising a pixel electrode, an emission layer, and an opposite electrode;

a functional layer on the display element;

a thin-film encapsulation layer on the functional layer;

a light blocking layer on the thin-film encapsulation layer, the light blocking layer comprising an opening corresponding to an emission area of the display element; and a reflection control layer filling the opening of the light blocking layer, wherein the functional layer comprises bismuth (Bi) and comprises a plurality of island-type grains and a grain boundary between the plurality of grains, and wherein a first area including a lower surface of the functional layer comprises a smaller amount of oxygen than a second area including an upper surface of the functional layer.

14. The display device of claim 13, wherein the grains are grown in a [110] crystal direction.

15. The display device of claim 13, wherein the grains each have a grain size of 8 nm or more and 20 nm or less.

16. The display device of claim 13, further comprising a capping layer between the opposite electrode and the functional layer, wherein the thin-film encapsulation layer comprises a first inorganic encapsulation layer on the functional layer.

17. The display device of claim 16, wherein the functional layer comprises an opening exposing the capping layer.

18. The display device of claim 16, wherein the thin-film encapsulation layer further comprises an organic encapsulation layer and a second inorganic encapsulation layer, which are sequentially on the first inorganic encapsulation layer in this stated order.

* * * * *